United States Patent
Imanishi (10) Patent No.: US 6,867,439 B2
(45) Date of Patent: Mar. 15, 2005

(54) FIELD-EFFECT TRANSISTOR USING A GROUP III-V COMPOUND SEMICONDUCTOR

(75) Inventor: Kenji Imanishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/981,842

(22) Filed: Oct. 19, 2001

(65) Prior Publication Data

US 2002/0139994 A1 Oct. 3, 2002

(30) Foreign Application Priority Data

Feb. 22, 2001 (JP) ........................................ 2001-047280

(51) Int. Cl.$^7$ ............................................ H01L 29/778
(52) U.S. Cl. ........................................ 257/194; 257/24
(58) Field of Search ........................... 257/23, 24, 192, 257/194, 20

(56) References Cited

U.S. PATENT DOCUMENTS

| 5,373,168 A | * | 12/1994 | Ando et al. | .................... 257/24 |
| 5,432,356 A | * | 7/1995 | Imamura | ..................... 257/24 |
| 5,596,211 A | * | 1/1997 | Onda et al. | .................. 257/194 |
| 5,825,796 A | * | 10/1998 | Jewell et al. | .................. 372/45 |
| 6,100,542 A | * | 8/2000 | Kohara et al. | ................. 257/20 |

FOREIGN PATENT DOCUMENTS

| JP | 4-291934 | * 10/1992 | ......... H01L/21/338 |
| JP | 6-236898 | 8/1994 | |

OTHER PUBLICATIONS

English translation of JP 4–291934.*
JPO machine translation of JP 6–236898.*
JPO computer translation of JP 6–236898.*

* cited by examiner

*Primary Examiner*—Bradley William Baumeister
(74) *Attorney, Agent, or Firm*—Westerman, Hattori, Daniels & Adrian, LLP

(57) ABSTRACT

A high electron mobility transistor using a Group III-V compound semiconductor comprises an undoped second channel layer laminated on an InP substrate via a buffer layer, an undoped first channel layer laminated on the second channel layer, and a doped electron-supplying layer laminated on the first channel layer. The first channel layer is composed of $In_{1-x}Ga_xAs$ and has an energy level of conduction band lower than that of the electron-supplying layer at the interface. The second channel layer is composed of a Group III-V compound semiconductor using a Group V element other than P, has an energy level of conduction band higher than that of the first channel layer, and has a band gap wider than that of the first channel layer.

14 Claims, 6 Drawing Sheets

1: InP
2: i-InAlAs
3: i-In$_{0.35}$Ga$_{0.65}$As
4: i-In$_{0.53}$Ga$_{0.47}$As
5: i-InAlAs
6: n-InAlAs
7: i-InAlAs
8: InP/InAlAs/InGaAs

FIELD-EFFECT TRANSISTOR USING A GROUP III-V COMPOUND SEMICONDUCTOR

BACKGROUND OF THE INVENTION

1. Field of the Invention

The present invention relates to a field-effect transistor using a Group III-V compound semiconductor, and more particularly to a high electron mobility transistor in which the impact ionization effect can be suppressed.

2. Description of the Related Art

In a high electron mobility transistor (HEMT) which is a field-effect transistor using a Group III-V compound semiconductor, an electron supply layer including a dopant is laminated with a channel layer containing no dopant, a two-dimensional electron gas is generated in the channel layer and the electrons flow in the channel layer containing no dopant so that a high-speed characteristic is obtained. Owing to this high-speed characteristic, the HEMTs have been widely used, for example, in amplifiers employed in communication systems.

In the conventional HEMTs, it was suggested to employ an $In_{1-x}Ga_xAs$ layer as the channel layer where the electrons flow, thereby further improving performance by using high electron mobility and high concentration of the two-dimensional electron gas produced in $In_{1-x}Ga_xAs$. Such HEMTs are fabricated by laminating a layer of a Group III-V compound semiconductor lattice matched to the InP substrate surface. The composition ratio of $In_{1-x}Ga_xAs$ in this case is x=0.47. A structure in which the lattice constants of the layer laminated on a substrate is not significantly different from the lattice constants of the substrate is called a pseudomorphic structure. However, even when the lattice of the laminated crystal layer shifts from that of the substrate, when the thickness of this crystal layer is no more than the critical thickness, the crystal growth can be conducted without loosing the properties of the crystal layer. In such case, the above-mentioned composition ratio of $In_{1-x}Ga_xAs$ is not limited to x=0.47.

Figure 5:
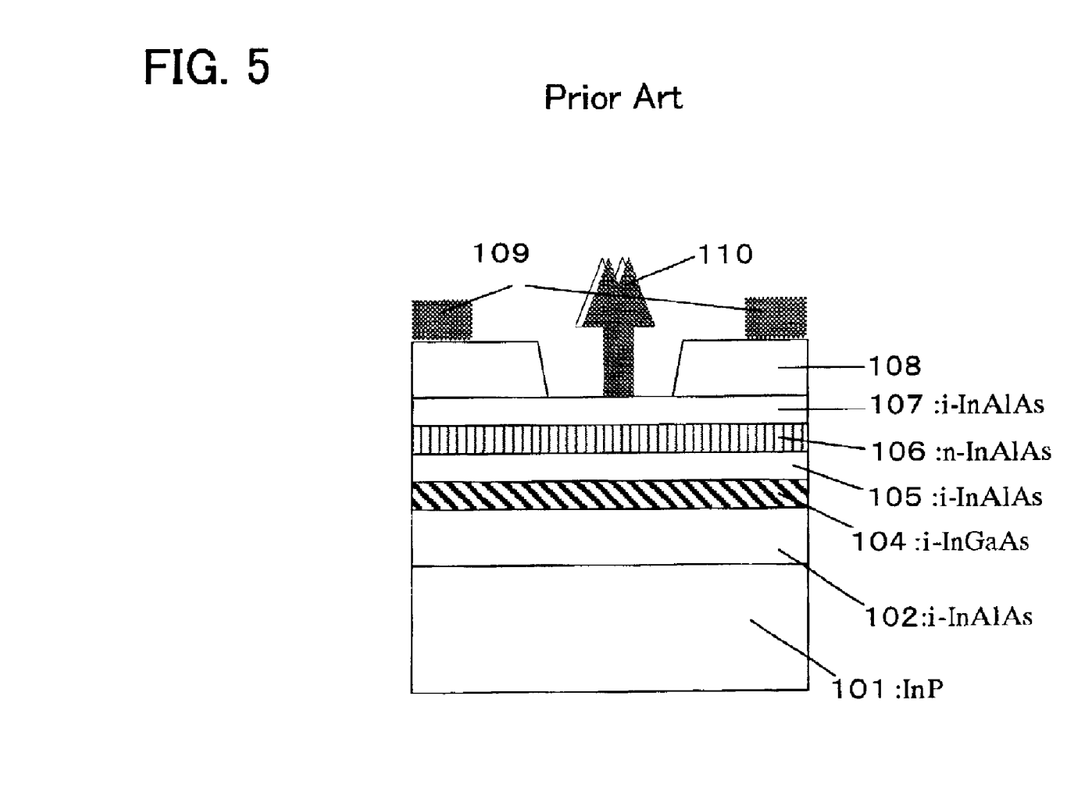
FIG. 5 illustrates the configuration of the HEMT using the conventional $In_{1-x}Ga_xAs$ layer as the channel layer.

FIG. 5 illustrates a conventional configuration of a HEMT using the $In_{1-x}Ga_xAs$ layer as the channel layer. In such InP-type HEMT, an I-type (intrinsic:undoped) $In_{1-y}Al_yAs$ buffer layer 102 almost lattice matched to InP, an I-type $In_{1-x}Ga_xAs$ channel layer 104, and I-type $In_{1-y}Al_yAs$ spacer layer 105, and an N-type $In_{1-y}Al_yAs$ electron-supplying layer 106 including a dopant such as Si are laminated on a semi-insulating InP substrate 101. An I-type $In_{1-y}Al_yAs$ barrier layer 107 and a cap layer 108 are laminated on the electron-supplying layer 106, ohmic electrodes 109 serving as source and drain electrodes are formed on the cap layer 108, and a gate electrode 110 is formed on the barrier layer 107.

The $In_{1-x}Ga_xAs$ channel layer 104 lattice matched to InP can increase the difference in the bottom energy level of conduction band at the interface with the n-$In_{1-y}Al_yAs$ electron-supplying layer 105 which is also lattice matched to InP, and the concentration of the two-dimensional electron gas generated in the channel layer 104 can be increased accordingly. The two-dimensional electron gas layer with a high concentration can increase the drain current and raise the current drive capability of the transistor. Furthermore, since the $In_{1-x}Ga_xAs$ channel layer 104 itself has a high electron mobility, the increase in the drain current can be made steep even in a low electric field with a low voltage between the drain and the source so that a high-speed response can be achieved.

However, a problem associated with such InP-type HEMT is that the drain resistance increases in current stress tests conducted at a high temperature. This is apparently because the $In_{1-x}Ga_xAs$ channel layer contributing to the high-speed characteristic, as described above, has a small energy band gap and, therefore, the impact ionization ratio during the application of a high electric field is increased, the electron-hole pairs generated by the impact ionization produce an excess current in the drain, and the drain resistance is degraded. The excess current caused by such impact ionization is observed as a drain conductance increase in the current-voltage characteristic of the HEMT and represents a serious problem from the standpoint of circuit design. In the I-V characteristic of the transistor, the drain conductance increase is represented by a kink.

In order to suppress such kink, a HEMT using an $In_{1-x}Ga_xAs_{1-y}P_y$ layer as a channel layer has been suggested. For example, Japanese Patent Application Laid-open No. H6-236898 disclosed a HEMT in which an $In_{1-x}Ga_xAs_{1-y}P_y$ channel layer and an $In_{1-y}Al_yAs$ electron-supplying layer were laminated on an InP substrate. Furthermore, in order to avoid the decrease in the concentration of two-dimensional electron gas in the $In_{1-x}Ga_xAs_{1-y}P_y$ layer, it was suggested to use a two-layer channel structure composed of an $In_{1-x}Ga_xAs$ layer and an $In_{1-x}Ga_xAs_{1-y}P_y$ layer.

Figure 6:
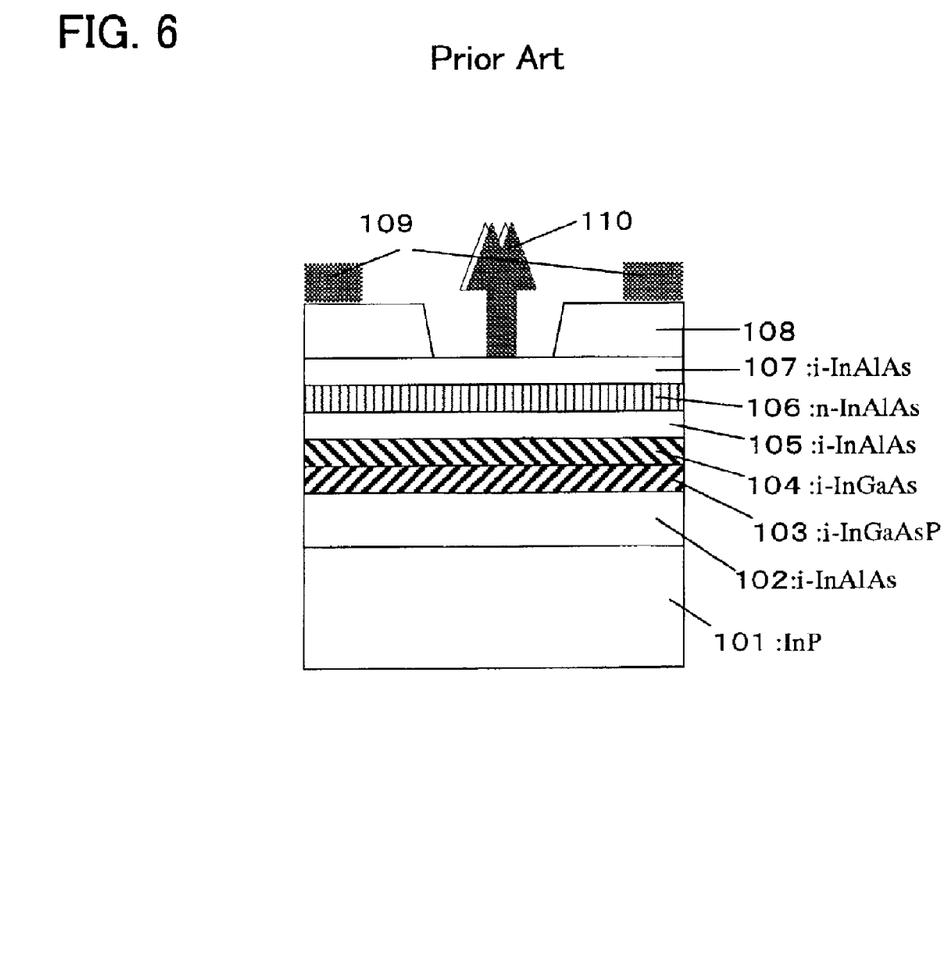
FIG. 6 illustrates the configuration of the HEMT using the conventional $In_{1-x}Ga_xAs$ and $In_{1-x}Ga_xAs_{1-y}Py$ two-layer channel layer.

FIG. 6 illustrates the conventional configuration of a HEMT using the two-layer channel layer composed of $In_{1-x}Ga_xAs$ and $In_{1-x}Ga_xAs_{1-y}P_y$. Layers identical to those shown in FIG. 5 are assigned with the same reference numbers. The difference between the HEMT shown in FIG. 6 and that shown in FIG. 5 is in that the I-type (undoped) $In_{1-x}Ga_xAs$ channel layer 104 is formed in addition to the I-type (undoped) $In_{1-x}Ga_xAs_{1-y}P_y$ channel layer 103 formed on the buffer layer 102. Thus, when the channel layer comprises an undoped $In_{1-x}Ga_xAs_{1-y}P_y$ layer and an $In_{1-x}Ga_xAs$ layer, the $In_{1-x}Ga_xAs$ is provided at the side of the electron-supplying layer 106, which has a narrow band gap and a higher difference in the energy of conduction band at the interface with the electron-supplying layer, thereby increasing the concentration of two-dimensional electron gas, and the $In_{1-x}Ga_xAs_{1-y}P_y$ layer with a low impact ionization ratio is provided at the side of the buffer layer 102.

However, in the HEMT structure shown in FIGS. 5 and 6, a separation groove from the cap layer 108 to the buffer layer 102 has to be formed for the purpose of isolation. The formation of the separation groove is usually conducted by wet etching. In this case, if the $In_{1-x}Ga_xAs_{1-y}P_y$ layer is used as the channel layer shown in FIG. 6, a wet etching process has to be used which is different from that employed for the other layers using only As as the Group V semiconductor. Generally, the compound semiconductor layer using P as the Group V semiconductor requires a wet etching process different from a wet etching process required for the compound semiconductor layer containing no P. Therefore, the element separation process employed in the fabrication of the conventional HEMT structure shown in FIG. 6 was complicated and unsuitable for actual mass production.

Furthermore, in order to lattice match the $In_{1-x}Ga_xAs_{1-y}P_y$ layer with the InP substrate, it is necessary to control the composition ratio x of the Group III element and the composition ratio y of the Group V element at the same time. In addition, the mixed crystals of the Group V are typically difficult to grow.

SUMMARY OF THE INVENTION

With the forgoing in view, it is an object of the present invention to provide a high electron mobility transistor (HEMT) which can be fabricated by a simple process, has a channel layer with a high electron mobility in a low electric filed, and also with a suppressed impact ionization in a high electric field.

In order to attain this object, in accordance with one aspect of the present invention, a high electron mobility transistor using a Group III-V compound semiconductor comprises an undoped second channel layer laminated on an InP substrate via a buffer layer, an undoped first channel layer laminated on the second channel layer, and a doped electron-supplying layer laminated on the first channel layer. The first channel layer is composed of $In_{1-x}Ga_xAs$ and has an energy level of conduction band lower than that of the electron-supplying layer at the interface. The second channel layer is composed of a Group III-V compound semiconductor using a Group V element other than P, has an energy level of conduction band higher than that of the first channel layer, and has a band gap wider than that of the first channel layer.

In the preferred embodiment of the above-described present invention, the electron-supplying layer is composed of $In_{1-y}Al_yAs$, the first channel layer is composed of $In_{1-x}Ga_xAs$, the second channel layer is composed of $In_{1-x}(Al_{1-z}Ga_z)_xAs$, and the buffer layer is composed of $In_{1-y}Al_yAs$. With such combination, a sufficient difference in the energy levels of conduction bands can be formed between the first channel layer of $In_{1-x}Ga_xAs$ and the electron-supplying layer of N-type $In_{1-y}Al_yAs$, the concentration of two-dimensional electron gas can be increased, and a high-speed characteristic in a low electric field can be obtained owing to a high electron mobility of $In_{1-x}Ga_xAs$.

Furthermore, since a second channel layer of $In_{1-x}(Al_{1-z}Ga_z)_xAs$ is formed at the buffer layer side in addition to the first channel layer of $In_{1-x}Ga_xAs$, the increase in the drain conductance caused by impact ionization in a high electric field can be prevented. In other words, since in a high electric field the majority of the flowing electrons flow in the second channel layer, the impact ionization effect is suppressed more effectively than when only the first channel layer of $In_{1-x}Ga_xAs$ is formed.

Moreover, with the above-described combination, all layers of the buffer layer, the first and second channel layers, and the electron-supplying layer formed on the InP substrate contain no P and use only As as the Group V semiconductor. Therefore, the process of forming the isolation groove (isolation mesa etching) can be simplified. Furthermore, the growth of the second channel layer also can be simplified. Further, antimony (Sb) may be introduced in As as the Group V semiconductor.

In the above-described combination, the composition ratio (1-z) of Al in the second channel layer $In_{1-x}(Al_{1-z}Ga_z)_xAs$ is preferably within a range of about 0.1~0.5. If the composition ratio of Al is too high, the composition becomes close to that of the buffer layer of $In_{1-y}Al_yAs$ and the discontinuity of conduction band energy cannot be formed at the interface between the second channel layer and the buffer layer. As a result, at least two quantum levels are easily formed in the first channel layer. Furthermore, if the composition ratio of Al is too low, the composition becomes close to that of the first channel layer of $In_{1-x}Ga_xAs$ and impact ionization cannot be efficiently suppressed. Thus, by incorporating Al, which is a Group III element, in the first channel layer of $In_{1-x}Ga_xAs$, the second channel layer is enabled to have a wider band gap than that of the first channel layer, and to obtain a conduction band energy level between those of the first channel layer and buffer layer, while maintaining lattice matching with the InP substrate. Thus, the combination becomes that of the first channel layer of $In_{0.53}Ga_{0.47}As$ and the second channel layer of $In_{0.53}(Al_{1-z}Ga_z)_{0.47}As$.

In accordance with the above-described invention, the first and second channel layers are preferably formed to be so thin as to have discrete quantum levels therein, with the first quantum level being formed only in the first channel layer and the second quantum level being spread over the first and second channel layers. With such thickness control, the electrons are mainly distributed to the first quantum level in the first channel when a low electric field is applied between the drain and the source, but when a higher electric field is applied, the electrons are also distributed to the second quantum level present in the first and second channel layers. Thus, in a low electron filed, the electrons mainly flow in the first channel layer of $In_{1-x}Ga_xAs$, whereas in a high electric field they also flow in the second channel layer of $In_{1-x}(Al_{1-z}Ga_z)_xAs$. As a result, a high electron mobility in a low electric field and a low impact ionization ratio in a high electric field can be achieved at the same time.

In order to achieve the above quantization, it is desired that the thickness of the first channel layer of $In_{1-x}Ga_xAs$ be, for example, 3~7 nm and that of the second channel layer of $In_{1-x}(Al_{1-z}Ga_z)_xAs$ be, for example, of 10~20 nm.

In another aspect of the above-described invention, the electron-supplying layer is composed of $In_{1-y}Al_yAs$, the first channel layer is composed of $In_{1-x}Ga_xAs$, the second channel layer is composed of $In_{1-x2}Ga_{x2}As$ which has a lower composition ratio of In and a higher composition ratio of Ga than those in the first channel layer, and the buffer layer is composed of $In_{1-y}Al_yAs$. In this case, the second channel layer is composed of $In_{1-x2}Ga_{x2}As$ which has a lower composition ratio of In and a higher composition ratio of Ga than those in the first channel layer and the lattice constants of this layer do not necessarily match those of $In_{1-y}Al_yAs$ of the buffer layer. However, if the film growth is conducted to a thickness of no more than the critical film thickness at which the lattice constants are not changed, a second channel layer can be implemented whose conduction band energy level is higher and band gap is wider than those in the first channel layer of $In_{1-x}Ga_xAs$ and which is lattice matched to InP. Moreover, since such second channel layer containing no P in the Group V semiconductor, the isolation mesa etching process can be simplified.

DESCRIPTION OF THE PREFERRED EMBODIMENTS

The preferred embodiment of the present invention will be described below with reference to the drawings.

However, the scope of protection of the present invention is not limited to the below-described embodiments and covers the invention described in the claims and equivalents thereof.

Figure 1:
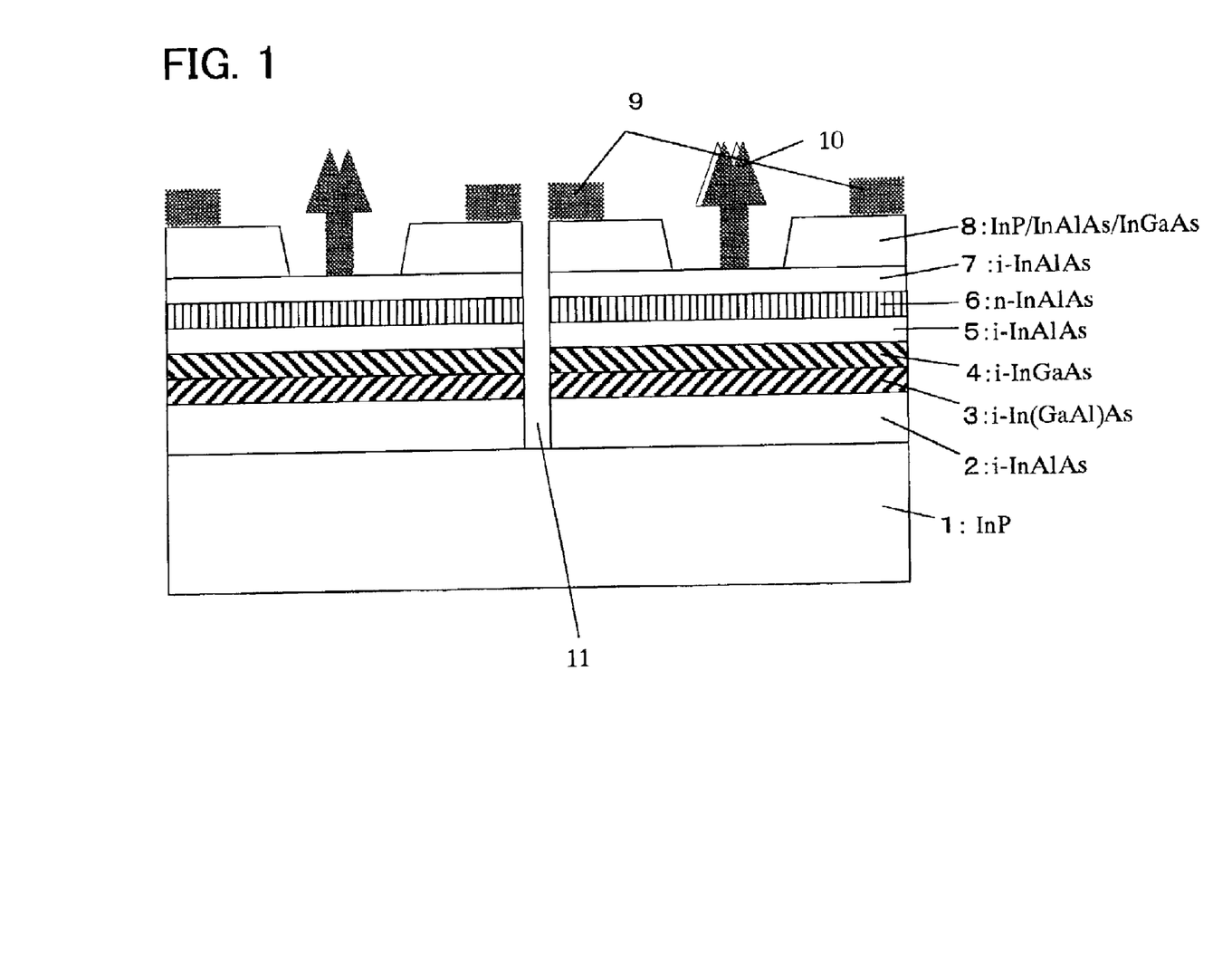
FIG. 1 illustrates the configuration of the HEMT of an embodiment.

FIG. 1 shows a configuration of the HEMT of the present embodiment. In FIG. 1, two HEMTs are formed in parallel and an isolation groove 11 extending from the surface to the buffer layer 2 is formed therebetween. In the HEMT of this embodiment, an undoped (I type) $In_{1-y}Al_yAs$ buffer layer 2 with a thickness, for example, of 200 nm, an undoped $In_{1-x}(Al_{1-z}Ga_z)_xAs$ second channel layer 3 with a thickness, for example, of 10 nm, an undoped $In_{1-x}Ga_xAs$ first channel layer 4 with a thickness, for example, of 5 nm, an undoped $In_{1-y}Al_yAs$ spacer layer 5 with a thickness, for example, of 3 nm, an n-type $In_{1-y}Al_yAs$ electron-supplying layer 6 doped with Si to $5 \times 10^{18}/cm^3$ and having a thickness, for example, of 7 nm, and an undoped $In_{1-y}Al_yAs$ barrier layer 7 with a thickness, for example, of 10 nm are successively formed on a semiconductor insulating InP substrate 1. In order to form a transistor, a cap layer 8 having a three-layer structure of $InP/In_{0.52}Al_{0.48}As/In_{0.53}Ga_{0.47}As$ is further laminated on the barrier layer 7. A MOCVD method is an appropriate growth method.

In all of those layers, from the buffer layer 2 to the barrier layer 7, the composition ratios of respective Group III elements is selected so as to lattice match with the InP substrate 1. Therefore, the buffer layer 2, spacer layer 5, electron-supplying layer 6, and barrier layer 7 are preferably $In_{0.52}Al_{0.48}As$ and the first channel layer is preferably $In_{0.53}Ga_{0.47}As$. Further, it is preferred that in the second channel layer of $In_{1-x}(Al_{1-z}Ga_z)_xAs$, the composition ratio (1-x) of In be within a range of 0.53~0.52, the combined composition ratio x of Al and Ga be within a range of 0.47~0.48, and the composition ratio (1-z) of Al for Al and Ga be within a range of 0.05~0.5. This composition ratio of Al to Ga will be described below.

After the buffer layer 2, second channel layer 3, first channel layer 4, spacer layer 5, electron-supplying layer 6, barrier layer 7, and cap layer 8 have been laminated on the InP substrate 1, an element separation groove 11 extending from the surface to the buffer layer 2 is formed by the ordinary lithography process. In the figure, the separation groove 11 passes through the entire buffer layer 2, but it is preferred that the separation groove stops inside the buffer layer 2. The element separation groove 11 is formed by removing $In_{0.53}Ga_{0.47}As/In_{0.52}Al_{0.48}As$ of the cap layer 8 by wet etching with a mixture of phosphoric acid, aqueous hydrogen peroxide, and water, then removing InP of the cap layer 8 by wet etching with a mixture of hydrochloric acid and phosphoric acid, and then removing the remaining layers to the buffer layer by wet etching with a mixture of phosphoric acid, aqueous hydrogen peroxide, and water. In the etching process, once InP of the cap layer 8 has been removed, the only Group V element in all of the layers 2–8 is As and the layers contain no P. Therefore, the element separation groove 11 can be formed by a simple etching process using the above-described etching solutions.

Then, the area outside the recess area surrounding a gate electrode 10 is masked by a well-known lithography process, a portion of the cap layer 8 is etched out with a mixture of phosphoric acid, aqueous hydrogen peroxide, and water, this mixture, for example, being identical to the aforesaid mixture, and an InP stopper layer located immediately above the $In_{1-y}Al_yAs$ barrier layer 7 is exposed. Ohmic electrodes 9, for example having a Ti/Pt/Au three-layer structure, are then formed on the remaining cap layer 8 by mask patterning, deposition, and lift-off method. Then, a gate electrode 10, for example, consisting of Al is formed on the InP stopper layer by mask patterning, deposition and lift-off method. Then, the InP stopper layer can also be removed by etching. This etching can be wet etching using a mixture of hydrochloric acid and phosphoric acid. When the InP stopper layer is removed, the gate electrode 10 is directly connected to the barrier layer 7.

In the above-described HEMT structure, As is the only Group V element composing all of the layers from the buffer layer 2 to the barrier layer 7, including the channel layer 3. Therefore, when those layers are formed by a MOCVD method, the composition ratio of Group III elements can be easily controlled. For example, since the buffer layer 2, spacer layer 5, electron-supplying layer 6, and barrier layer 7 are $In_{1-y}Al_yAs$ (y≈0.48), a film which is lattice matched to InP can be grown by controlling only the composition ratio x of In and Al which are the Group III elements. A film of $In_{1-x}Ga_xAs$ (x≈0.47) of the first channel layer 4 can be also grown so as to be lattice matched to the InP substrate by controlling only the composition ratio of In and Ga which are the Group III elements. Furthermore, $In_{1-x}(Al_{1-z}Ga_z)_xAs$ of the second channel layer 3 can be lattice matched to the InP substrate 1 by controlling the composition ratio x of In and $(Al_{1-z}Ga_z)$ which are the Group III elements, without controlling the composition ratio z of Al and Ga. However, the transistor performance should be increased by controlling the composition ratio z of Al and Ga to a certain range, as described below.

On the other hand, in the conventional example shown in FIG. 6, the second channel layer 103 is $In_{1-x}Ga_xAs_{1-y}P_y$, where the Group III elements are In and Ga and Group V elements are As and P. Therefore, film growth has to be conducted by controlling both composition ratios x, y of the elements of both groups. Moreover, mixed crystals of Group V elements are relatively difficult to grow or control. In this terms, too, the formation of the second layer using $In_{1-x}(Al_{1-z}Ga_z)_xAs$ in the present embodiment is more practical.

Figure 2:
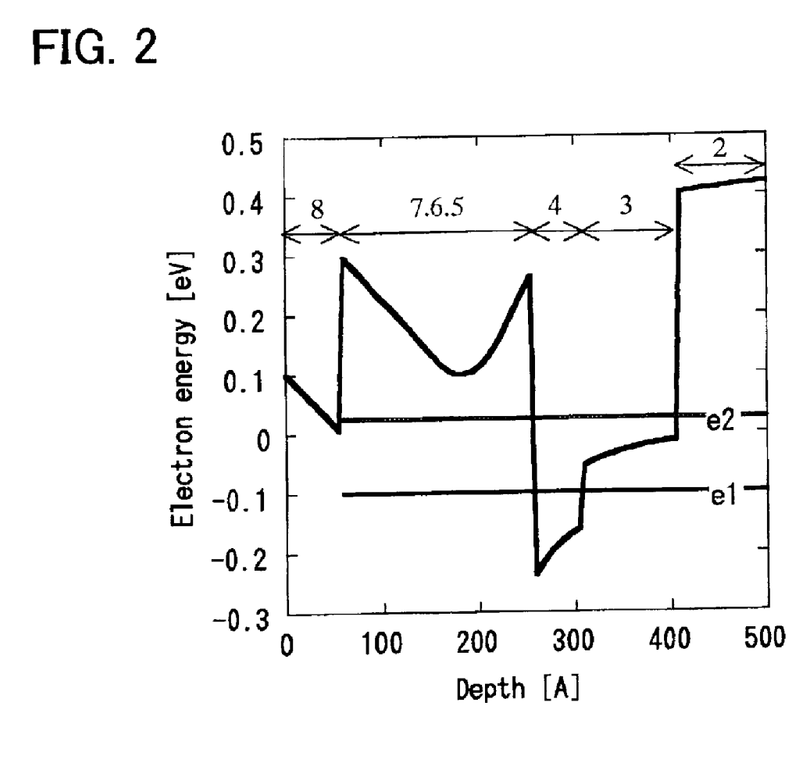
FIG. 2 illustrates bottom energy levels of conduction band in various layers across the depth from the gate electrode 10 of the HEMT of the embodiment.

FIG. 2 illustrates the bottom energy levels of conduction bands of various layers across the depth from the gate electrode 10 of the HEMT of the present embodiment. In the figure, the layers laminated under the gate electrode 10 are represented by numbers 2~8. The layer 8 is a part of IuP layer of the cap layer 8, on which the gate electrode is provided. Since the electron-supplying layer 6 and the spacer layer 5 and barrier layer 7 located above and below thereof are all $In_{1-y}Al_yAs$ (y≈0.48), the electron affinity is comparatively low and the bottom energy level of conduction band is higher. By contrast, the first channel layer 4 is $In_{1-x}Ga_xAs$ (x≈0.47) and is lattice matched to the electron-supplying layer 6 or spacer layer 5. Its electron affinity is higher than in these layers and the bottom energy level of conduction band is lower.

Since the buffer layer 2 is $In_{1-y}Al_yAs$ (y≈0.48), same as the electron-supplying layer 6, its electron affinity is comparatively lower and the bottom energy level of conduction band is higher. By contrast, in $In_{1-x}(Al_{1-z}Ga_z)_xAs$, which is the material of the second channel layer 3, the addition of Al element to $In_{1-x}Ga_xAs$, which is the material of the first channel layer 4, makes it possible to control the electron affinity to a value between that of $In_{1-x}Ga_xAs$ (x≈0.47) and that of $In_{1-y}Al_yAs$ (y≈0.48), while maintaining the lattice match.

Here, controlling the composition ratio of Al element in $In_{1-x}(Al_{1-z}Ga_z)_xAs$ of the second channel layer 5, as described above, to about (1-z)=0.05~0.5 makes it possible to obtain a layer having a bottom energy level of conduction band between that of the first channel layer 4 and that of the buffer layer 2, while maintaining the lattice match. Moreover, the band gap (width of forbidden zone) of $In_{1-x}(Al_{1-z}Ga_z)_xAs$ of the second channel layer can be made greater than that of $In_{1-x}Ga_xAs$ of the first channel layer 4. Therefore, the impact ionization ratio of $In_{1-x}(Al_{1-z}Ga_z)_xAs$ of the second channel layer 3 is decreased by comparison with that of $In_{1-x}Ga_xAs$ of the first channel layer 4. Further, it can be readily understood that the higher is the composition ratio of Al in $In_{1-y}(Al_{1-z}Ga_z)_xAs$, the closer this composition to $In_{1-y}Al_yAs$ (y≈0.48) of the electron-supplying layer 6 or buffer layer 2.

The first and second channel layers 4, 3 are formed so thin as to provide for quantization. As a result, energy levels discretely appear in those channel layers 4, 3. As shown in FIG. 2, in this embodiment, the thickness of respective films 3, 4 and the composition ratio of Al element in the second channel layer 3 are controlled so that the first quantum level e1 is present only in the first channel layer 4 and the second quantum level e2 is present in the first and second channel layers 4, 3. In the example shown in FIG. 2, the composition ratio of Al is 1-z=0.2, the thickness of $In_{1-x}Ga_xAs$ of the first channel layer 4 is 5 nm, and the thickness of $In_{1-y}Al_yAs$ of the second channel layer 3 is 10 nm.

The inventors tested the HEMT shown in FIG. 1 and checked the characteristics thereof. One of the reasons for using $In_{1-x}Ga_xAs$ for the first channel layer 4 is a high electron mobility and high concentration of two-dimensional electron gas therein. A high concentration of two-dimensional electron gas can increase the current drive capability and mutual conductance. Here, the addition of $In_{1-x}(Al_{1-z}Ga_z)_xAs$ as the second channel layer 5 should not lose the aforesaid high electron mobility and mutual conductance.

Figure 3A:
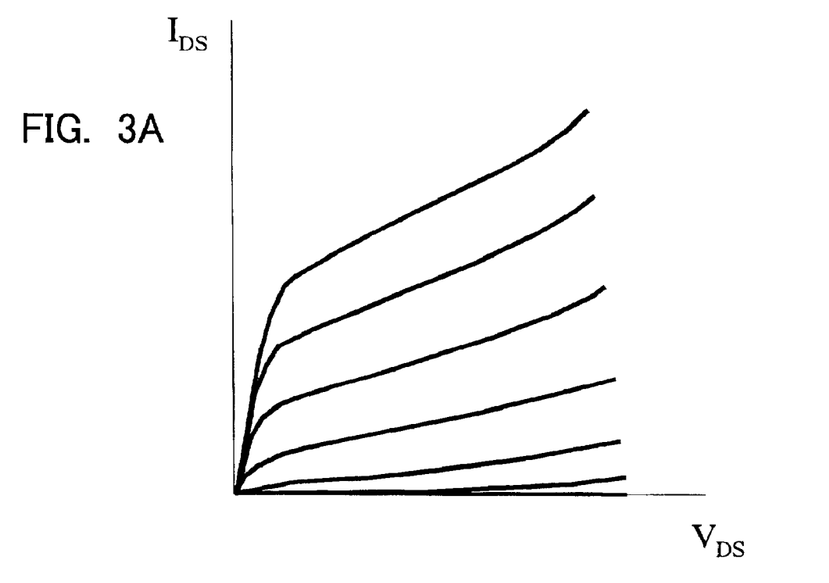
FIG. 3 illustrates current-voltage characteristics in the embodiment and conventional example.
Figure 3B:
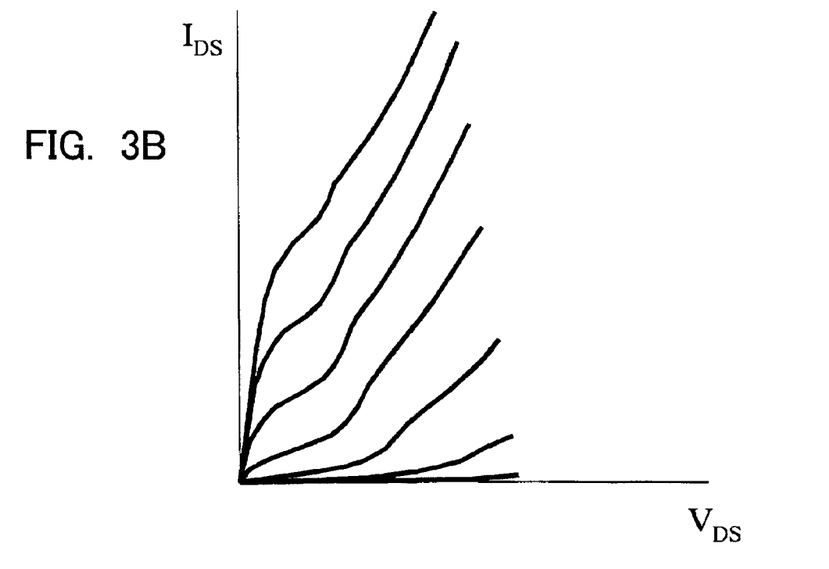

FIG. 3 shows current-voltage characteristics relating to the present embodiment and a conventional example. FIG. 3A is a current-voltage characteristic in the HEMT shown in FIG. 1, for example, relating to a case when the composition ratio of Al element in the second channel layer is about 0.2. FIG. 3B is a current-voltage characteristic in the HEMT shown in FIG. 5. In both cases, the drain-source voltage VDS is plotted against the abscissa and the drain-source current IDS is plotted against the ordinate. The VDS-IDS characteristics relate to a case when the respective gate voltage was changed.

In the conventional example shown in FIG. 3B(2), the channel layer is composed only of $In_{1-x}Ga_xAs$. If the drain-source voltage VDS rises, the excess current in the drain increases, the inclination of the drain-source current IDS rapidly increases, and the drain conductance rises. By contrast, in the embodiment illustrated by FIG. 3A, the channel layer was a composite film consisting of $In_{1-x}Ga_xAs$ and $In_{1-x}(Al_{1-z}Ga_z)_xAs$. As a result, the excess current was suppressed in the drain and no rapid increase in the drain-source current was observed.

FIG. 3 demonstrates that the addition of the second channel layer 3 makes it possible to suppress the drain conductance. Table shown below presents the results obtained by measuring the electron mobility, mutual conductance or trans conductance gm, and drain conductance gd when the composition ratio of Al element in the second channel layer was changed in the above-described embodiment.

TABLE 1

Characteristics of HEMT using the fiirst and second channel layers

| Composition ratio of Al element | Electron mobility $\mu(cm^2/V/s)$ | Mutual conductance (ms/mm) | Drain conductance gd(ms/mm) |
|---|---|---|---|
| 0.0 | 10,550 | 903 | 100 |
| 0.1 | 10,300 | 836 | 85 |
| 0.2 | 8,945 | 813 | 50 |
| 0.3 | 8,260 | 815 | 40 |
| 0.5 | 7,500 | 800 | 30 |

The characteristics of the above-described HEMT clearly show that even when $In_{1-x}(Al_{1-z}Ga_z)_xAs$ of the second channel layer is added, if the composition ratio of Al element is relatively low, the decrease in the electron mobility is made comparatively small. Furthermore, a comparatively small decrease is also achieved for the mutual conductance gm which is directly related to the current drive capability of transistor. By contrast, it was found that the drain conductance gd is suppressed significantly and therefore the addition of the second channel layer suppresses the impact ionization effect in a high electric field.

The aforesaid table shows that the appropriate composition ratio of Al in the second channel layer is about 0.05~0.5. When the composition ratio of Al element is 0.1, the drain conductance is greatly decreased. Therefore, a sufficient effect can be expected even at the composition ratio of about 0.05. Furthermore, it can be seen that if the composition ratio of Al element is 0.3, the decrease of the mutual conductance gm reaches a certain degree of saturation. Therefore, even if the composition ratio of Al element is increased to about 0.5, the drain conductance gd can be decreased significantly while the decrease in the mutual conductance is, conversely, being suppressed.

Furthermore, the aforesaid table demonstrates that it is even more preferred that the composition ratio of Al element in the second channel layer be 0.1~0.3, As shown in the table, when the composition ratio is within this range, the decrease in the drain conductance caused by $In_{1-x}(Al_{1-z}Ga_z)_x$ As of the second channel layer can be obtained almost without any loss in a high electron mobility and high mutual conductance caused by $In_{1-x}Ga_xAs$ of the first channel layer.

The operation of the HEMT of the present embodiment will be explained below with reference to FIG. 2. The electrons present in the electron-supplying layer 6 are supplied to the channel layers 4, 3 and a two-dimensional electron gas is generated in the channel layers. In a region with a lower electric field in which the drain-source voltage is lower, the electrons are mainly present at the first quantum level e1 in the first channel layer 4. Therefore, in a lower electric field, the electrons flow in the first channel layer 4 of $In_{1-x}Ga_xAs$ having a high electron mobility. Therefore, a high-speed response similar to that of the conventional example shown in FIG. 5 can be realized.

In a region with a higher electric field in which the drain-source voltage is higher, the electron energy level rises and the electrons are mainly present at the second quantum level e2. Since a larger number of electrons in second quantum levels e2 exist in the second channel layer 3 with a higher band gap, the impact ionization effect can be suppressed significantly.

In the embodiment illustrated by FIG. 1, antimony, Sb, may be introduced in the mixed crystal as the Group V element, which represents a modification of the second channel layer. When Sb is admixed, etching can be conducted with a mixed etching solution of phosphoric acid, aqueous hydrogen peroxide, and water, and the wet etching process used to form an element separation groove can be greatly simplified. Furthermore, forming $In_{1-x}(Al_{1-z}Ga_z)_x(As_{1-z2}Sb_{z2})$ can make the energy gap greater than that in $In_{1-x}Ga_xAs$ and smaller than that in $In_{1-y}Al_yAs$. Therefore, in this modification, even though the control in the MOCVD process becomes complex, but etching of the element separation groove is simplified.

Figure 4:
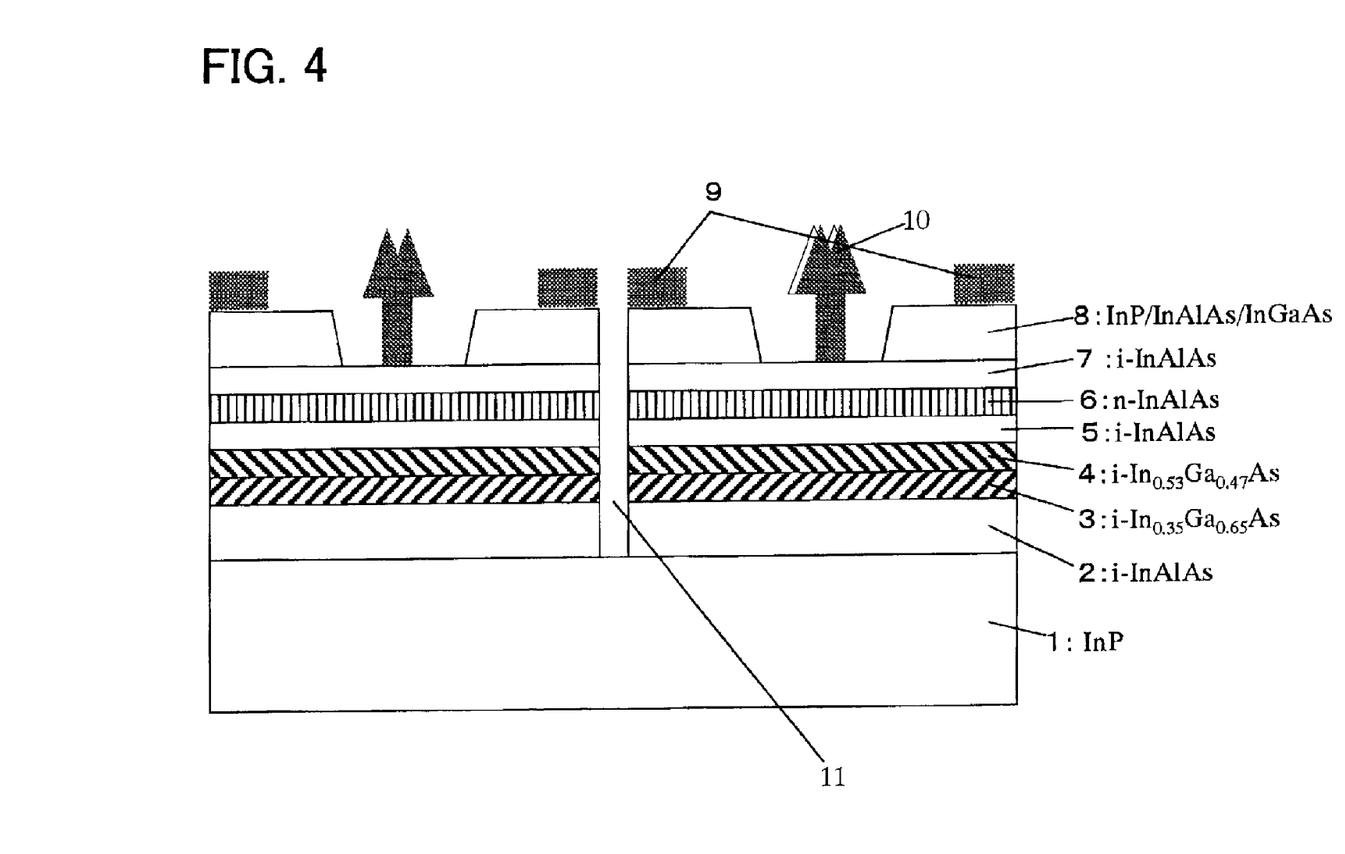
FIG. 4 illustrates the configuration of the HEMT of the second embodiment.

FIG. 4 shows the configuration of the HEMT of the second embodiment. In the second embodiment, the material of the second channel layer 3 is $In_{1-x}Ga_xAs$; all other components are the same as in the first embodiment shown in FIG. 1. In order to increase the band gap of the second channel layer 3 by comparison with that of the first channel layer 4 and to make the bottom energy level of the conduction band higher than that in the first channel layer 4 and lower than that in the buffer layer 2, the composition ratio of In element in the second channel layer 3 is reduced, for example, to 0.35 by comparison with that in the first channel layer 4. Accordingly the composition ratio of Ga component becomes 0.65.

$In_{0.53}Ga_{0.47}As$ of the first channel layer 4 and $In_{0.35}Ga_{0.65}As$ of the second channel layer 3 are not lattice matched. However, the lattice constants of the laminated crystal layers can be matched by controlling the thickness of the second channel layer 3 to a value less than the critical film thickness at which the lattice constants of the grown films in a growth plane are not changed. The thickness of the above-described second channel layer 3 of 10~20 nm is less than the aforesaid critical film thickness.

Using $In_{0.35}Ga_{0.65}As$ as the second channel layer 3, as described above, can simplify etching of the element separation groove 11, similarly to the first embodiment. Moreover, the MOCVD growth process can be also simplified.

In the above embodiments, the explanation was conducted under an assumption that one of $In_{1-x}(Al_{1-z}Ga_z)_xAs$, $In_{1-x}(Al_{1-z}Ga_z)_x(As_{1-z2}Sb_{z2})$, and $In_{0.35}Ga_{0.65}As$ is used as the second channel layer 3 and the composition ratio of respective elements is constant in the thickness direction. However, the present invention is not limited to such configuration and a graded layer can be also made in which the bottom energy level of conduction band increases successively from the first channel layer 4. If so, the composition ratio of Al increases gradually from 0 to 0.05~0.5 in case of $In_{1-x}(Al_{1-z}Ga_z)_xAs$ and $In_{1-x}(Al_{1-z}Ga_z)_x(As_{1-z2}Sb_{z2})$. In case of $In_{0.35}Ga_{0.65}As$, the composition ratio of In decreases gradually from 0.53 to 0.35. Alternatively, the bottom energy level of conduction band in the second channel layer 3 may increase successively in a step-like fashion.

Further, in the embodiments, the spacer layer 5 was provided between the electron-supplying layer 6 and the first channel layer 4, but the spacer layer 5 is optional.

In accordance with the present invention, the increase of drain conductance in an InP-type HEMT in a higher electric field can be suppressed.

What is claimed is:

1. A high electron mobility transistor us a Group III-V compound semiconductor, comprising:
an undoped second channel layer laminated on an InP substrate via a buffer layer;
an undoped first channel layer laminated on said second channel layer; and
an electron-supplying layer laminated in contact with said first channel layer,
wherein said first channel layer is composed of $In_{1-x}Ga_xAs$ and has an energy level of conduction band lower than that of said electron-supplying layer,
said second channel layer is composed of a Group III-V compound semiconductor using a Group V element other than P, has an energy level of conduction band higher than that of the first channel layer, has a band gap wider than that of the first channel layer, and has a thickness larger than that of the first channel layer,
wherein said first and second channel layers are formed to have a thickness small enough to have discrete quantum levels, a first quantum level with the lowest energy level being formed only in the first channel layer, and a second quantum level with the second lowest energy level being formed in both the first and second channel layers.

2. The high electron mobility transistor as described in claim 1, wherein said electron-supplying layer is composed of $In_{1-y}Al_yAs$, the first channel layer is composed of $In_{1-x}Ga_xAs$, and the second channel layer is composed of $In_{1-x}(Al_{1-z}Ga_z)_xAs$.

3. The high electron mobility transistor as described in claim 2, wherein the thickness of said first channel layer is 3~7 nm.

4. The high electron mobility transistor as described in claim 2, wherein the thickness of said second channel layer is 10~20 nm.

5. The high electron mobility transistor as described in claim 2, wherein the composition ratio (1-z) of Al element in said second channel layer is 0.05~0.5.

6. The high electron mobility transistor as described in claim 1, wherein said electron-supplying layer is composed of $In_{1-y}Al_yAs$, the first channel layer is composed of $In_{1-x}Ga_xAs$, and the second channel layer is composed of $In_{1-x}(Al_{1-z}Ga)_x(As_{1-z2}Sb_{z2})$.

7. The high electron mobility transistor as described in claim 6, wherein the thickness of said first channel layer is 3~7 nm.

8. The high electron mobility transistor as described in claim 6, wherein the thickness of said second channel layer is 10~20 nm.

9. The high electron mobility transistor as described in claim 6, wherein the composition ratio (1-z) of Al element in said second channel layer is 0.05~0.5.

10. The high electron mobility transistor as described in claim 1, wherein said electron-supplying layer is composed of $In_{1-y}Al_yAs$, the first channel layer is composed of $In_{1-x}Ga_xAs$, and the second channel layer is composed of $In_{1-x}Ga_xAs$ with the In composition ratio lower and the gallium composition ratio higher than those in the first channel layer.

11. The high electron mobility transistor as described in claim 1, wherein an element separation groove is formed which extends from said electron-supplying layer to said buffer layer.

12. A high electron mobility transistor using a Group III-V compound semiconductor, comprising:
an undoped second channel layer laminated on an InP substrate via a buffer layer and composed of $In_{1-x}(Al_{1-z}Ga_z)As$ (where the composition ratio (z-1) of Al is 0.05~0.5) which is lattice matched to InP,
an undoped first channel layer laminated on said second channel layer and composed of $In_{1-x}Ga_xAs$ which is lattice matched to InP,
an electron-supplying layer laminated in contact with said first channel layer and composed of $In_{1-y}Al_yAs$ which is lattice matched to InP, and wherein said first and second channel layers are formed to have a thickness small enough to have discrete quantum levels, a first quantum level with the lowest energy level being formed only in the first channel layer, and a second quantum level with the second lowest energy level being formed in both the first and second channel layers.

13. A high electron mobility transistor using a Group III-V compound semiconductor, comprising an undoped second channel layer laminated on an InP substrate via a buffer layer;

an undoped first channel layer laminated on said second channel layer; and an electron-supplying layer laminated in contact with said first channel layer, wherein said first channel layer is composed of $In_{1-x}Ga_xAs$ and has an energy level of conduction band lower than that of said electron-supplying layer, said second channel layer is composed of a Group III-V compound semiconductor using a Group V element other than P, has an energy level of conduction band higher than that of the first channel layer, and has a band gap wider an that of the first channel layer, wherein said electron-supplying layer is composed of $In_{1-y}Al_yAs$, the first channel layer is composed of $In_{1-x}Ga_xAs$, and the second channel layer is composed of $In_{1-x}(Al_{1-z}Ga_z)_xAs$, wherein the composition ratio (1-z) of Al element in said second channel layer is 0.05–0.5, wherein said first and second channel layers are formed to have a thickness small enough to have discrete quantum levels, a first quantum level with the lowest energy level being formed only in the first channel layer, and a second quantum level with the second lowest energy level being formed in both the first and second channel layers.

14. A high electron mobility transistor using a Group III-V compound semiconductor, comprising:

an undoped second channel layer laminated on an InP substrate via a buffer layer;

an undoped first channel layer laminated on said second channel layer; and an electron-supplying layer laminated in contact with said first channel layer, wherein said first channel layer is composed of $In_{1-x}Ga_xAs$ and has an energy level of conduction band lower than that of said electron-supplying layer, said second channel layer is composed of a Group III-V compound semiconductor using a Group V element other than P, has an energy level of conduction band higher than that of the first channel layer, has a band gap wider than that of the first channel layer, and has a thickness larger than that of the first channel layer wherein the doped electron-supplying layer, the undoped first channel layer and the undoped second channel layer are the group III-V compound semiconductor being lattice-matched to the InP substrate, wherein said first and second channel layers are formed to have a thickness small enough to have discrete quantum levels, a first quantum level with the lowest energy level being formed only in the first channel layer, and a second quantum level with the second lowest energy level being formed in both the first and second channel layers.

* * * * *